US006624382B2

(12) United States Patent
Kling

(10) Patent No.: US 6,624,382 B2
(45) Date of Patent: Sep. 23, 2003

(54) CONFIGURED-HOLE HIGH-SPEED DRILLING SYSTEM FOR MICRO-VIA PATTERN FORMATION, AND RESULTING STRUCTURE

(75) Inventor: Carl C. Kling, Cos Cob, CT (US)

(73) Assignee: Anvik Corporation, Hawthorne, NY (US)

(*) Notice: Subject to any disclaimer, the term of this patent is extended or adjusted under 35 U.S.C. 154(b) by 6 days.

(21) Appl. No.: 09/882,731

(22) Filed: Jun. 16, 2001

(65) Prior Publication Data

US 2002/0017511 A1 Feb. 14, 2002

Related U.S. Application Data

(62) Division of application No. 09/531,629, filed on Mar. 21, 2000.

(51) Int. Cl.[7] ........................ B23K 26/16; B23K 26/00; B23K 26/14

(52) U.S. Cl. ............................ 219/121.67; 219/121.68; 219/121.69; 219/121.7; 219/121.71

(58) Field of Search ....................... 219/121.67–121.69, 219/121.71, 121.85, 121.7, 121.75

(56) References Cited

U.S. PATENT DOCUMENTS 4,655,590 A * 4/1987 Aagano et al. ........ 219/121.76
4,789,770 A * 12/1988 Kasner et al. ........... 219/121.7
5,043,553 A * 8/1991 Corfe et al. ........... 219/121.67
5,093,548 A * 3/1992 Schmidt-Hebbel ..... 219/121.69
5,293,025 A * 3/1994 Wang ..................... 219/121.71
5,367,143 A * 11/1994 White, Jr. .............. 219/121.68
5,523,543 A * 6/1996 Hunter et al. .......... 219/121.62
5,578,229 A * 11/1996 Barnekov et al. ...... 219/121.67
5,609,779 A * 3/1997 Crow et al. ............ 219/121.71
5,635,966 A * 6/1997 Keefe et al. .................. 347/43
5,652,645 A * 7/1997 Jain ............................ 355/53
5,657,539 A * 8/1997 Orikasa et al. ........ 219/121.71
5,703,631 A * 12/1997 Hayes et al. .................. 347/47
5,739,502 A * 4/1998 Anderson et al. ........... 148/565
5,747,769 A * 5/1998 Rockstroh et al. ..... 219/121.69
5,841,099 A * 11/1998 Owen et al. ........... 219/121.69
5,910,255 A * 6/1999 Noddin ........................ 216/18
6,031,201 A * 2/2000 Amako et al. ......... 219/121.68
6,040,552 A * 3/2000 Jain et al. ................ 219/121.7
6,070,813 A * 6/2000 Durheim .................. 239/533.2
6,120,131 A * 9/2000 Murthy et al. ................ 347/47
6,130,009 A * 10/2000 Smith et al. ............. 219/121.7
6,189,772 B1 * 2/2001 Hembree ............... 228/180.22
6,228,311 B1 * 5/2001 Temple et al. ......... 219/121.71
6,276,057 B1 * 8/2001 Aihara et al. .............. 29/25.35
6,329,632 B1 * 12/2001 Fournier et al. ....... 219/121.61
6,409,308 B1 * 6/2002 Maher et al. ................. 347/47
6,423,934 B2 * 7/2002 Hasegawa et al. ....... 219/121.7

* cited by examiner

*Primary Examiner*—M. Alexandra Elve
*Assistant Examiner*—L. Edmondson
(74) *Attorney, Agent, or Firm*—Carl C. King

(57) ABSTRACT

Economical production of configured, laser-drilled, high-precision, ultra-miniature multiple-via-hole patterns is accomplished by multiplexing the homogenized, shaped, nearly-collimated output of one or more high-power excimer lasers into a set of beamlines, differently configured at different depths through the thickness of the substrate. A substrate delivery subsystem provides a continuous supply of film substrate strips or segments, which may be blanks or intermediates. Various stencils in a mask provide a cup-shaped partial hole, which is subsequently provided with a mating stem hole. Each stem portion of each hole is laser-drilled into the bottom of the cup portion from either above or below to form a via-hole with a desired configuration, such as stem-glass (or cup/funnel), as desired for multi-micro-via-hole arrays for filtering or for forming clog-resistant aerosol nozzles. Parameter changes of one or both of duration and focus may substitute for changes of mask to effect the changes in cup configuration as contrasted to stem configuration.

8 Claims, 3 Drawing Sheets

31
32
33
34
35
37
38
39
1
30
34
34

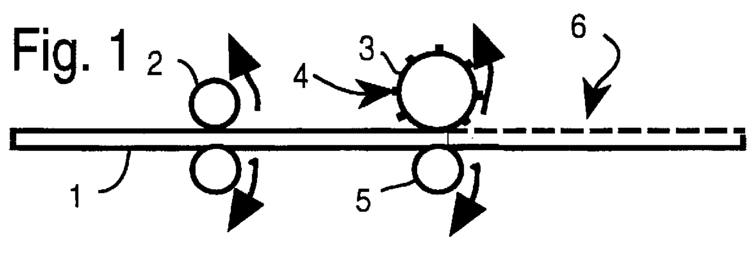
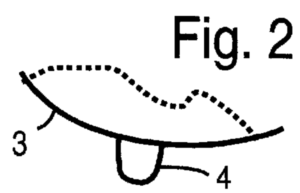
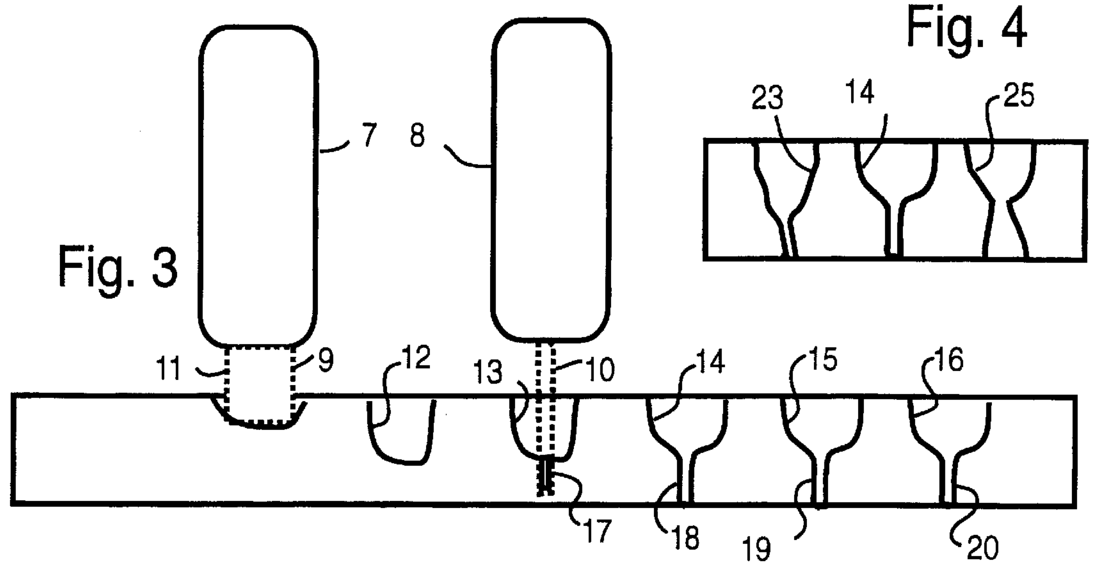
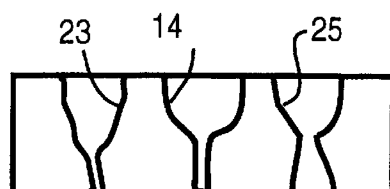
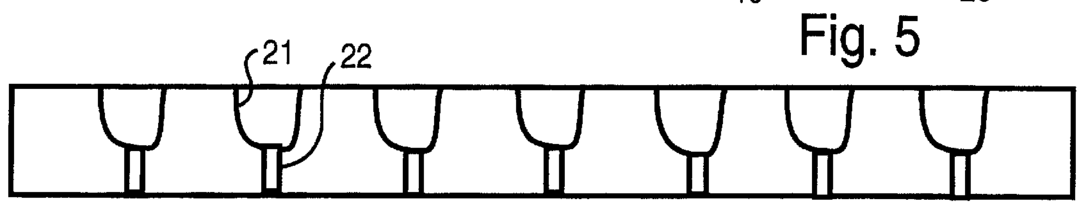
Fig. 6
23 24
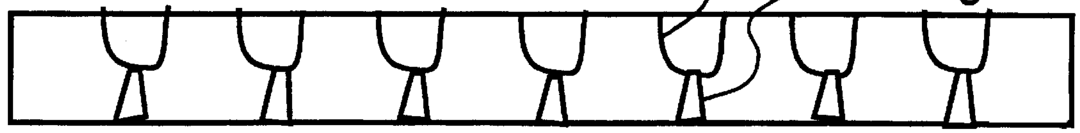

7
8'

9
10
14'
15'
16'
1
11
12
13
23
24

3
4

1

1
27
28
29

CONFIGURED-HOLE HIGH-SPEED DRILLING SYSTEM FOR MICRO-VIA PATTERN FORMATION, AND RESULTING STRUCTURE

CROSS-REFERENCE TO RELATED APPLICATION

This is a division of U.S. patent application Ser. No. 09/531,629, filed Mar. 21, 2000, CONFIGURED-HOLE HIGH-SPEED DRILLING SYSTEM FOR MICRO-VIA PATTERN FORMATION, AND RESULTING STRUCTURE, Kling.

BACKGROUND OF THE INVENTION

1. Field of the Invention

This invention relates to a via-drilling system and, more particularly, this invention relates to a low-cost, high-throughput drilling system for multi-micro-via-hole arrays, wherein each micro-via-hole is configured as a result of plural controlled applications of energy from sources including at least one patterned high-energy laser beam, resulting in an array of configured micro-via-holes.

2. Description of Related Art

The desire for multi-hole patterns of ultra-miniature via holes, are precisely located and of precise dimensions (multi-micro-via-hole patterns), is recognized in the fields of ink-jet print heads, aerosol generation and micro-filtering. Other, similar desires are expected as well, as other fields become more miniaturized. Miniaturization has far exceeded the capability of the metal drill bit, at least for high-precision via-drilling in tough substrates, because of bit breakage and bending, which not only destroys the drill bit but also destroys the symmetry and precision of the via-hole. Laser drilling is becoming the art of choice for drilling micro-via-holes. However, laser drilling is quite costly, and prior art technologies typically produce via-holes with low aspect ratios (hole depth: hole diameter of$\leqq$1:1), or produce imprecise via-hole dimensions. Such laser drilling has exhibited low yields of acceptable multi-micro-via-hole patterns. As miniaturization continues, laser output beams take on the characteristics of shotgun patterns, making an untreated laser beam unsuitable for multi-micro-via-hole-array drilling. A previous patent application, Ser. No. 08/794,217, filed Jan. 29, 1997, HIGH SPEED DRILLING SYSTEM FOR MICRO-VIA PATTERN FORMATION, AND RESULTING STRUCTURE, K. Jain, T. J. Dunn, N. O. Farmiga, C. S. Weisbecker & C. C. Kling, by a set of inventors which includes the inventor in this application, solves the shotgun pattern effect problem and many other problems with a technique involving a laser beam treated by homogenizer and projection optics to achieve an intense, self-luminous small-field image which is configured as a polygon. The substrate is scanned by complementary polygonal scans, through a mask, to ablate the desired via-hole pattern in a plastic ribbon. The previous patent application results in a via hole with entry aperture only somewhat larger than the exit aperture; the via hole is conical in configuration. A separate patent application, Ser. No. 08/889,307, filed Jul. 7, 1997, SIMULTANEOUS, TWO-SIDED PROJECTION LITHOGRAPHY SYSTEM, K. Jain, an inventor of the above patent application, has a technique for laser-imaging both sides of a substrate simultaneously, with registration of topside and bottom patterns. The technologies of these two prior art patent applications are useful in implementing this invention, but do not supply the control of configuration of micro-via-holes which is the subject matter of this invention.

BRIEF SUMMARY OF THE INVENTION

The object of the invention is to control the configuration of micro-via-holes in tough, thin substrates, by controlling partial drilling of micro-via-holes in a first step, and in a subsequent step by controlling patterned, homogenized laser ablation of the finished micro-via-holes within partially drilled holes produced during said first step.

Another object of the invention is to provide a novel laser micro-via-hole drilling system which can contemporaneously drill a large number of configured high-quality via-holes in a selected micro-via-hole array pattern, with exceptional precision, speed and economy.

A feature of the invention is the provision of a beam divider for efficiently separating the laser beam into a number of separate sub-beams for delivery of drilling pulses to top and bottom surfaces of pattern drilling beamlines simultaneously, registered so that the micro-via-hole is not only configured with a selected configuration but passes through the substrate in the selected alignment.

An advantage of the invention is that configured micro-via-holes may be made resistant to blockage by having the exit hole larger than the entry hole.

Another advantage of the invention is that the configuration of micro-via-holes is easily changed, allowing the same "soft tooling" equipment to serve in the laboratory by making prototypes, to serve as a pilot system to prove out techniques and product, and then to serve as an easily changed mass production tool —without the cost and risk of investing in special purpose "hard tooling."

Still another advantage of the invention is that the precision resulting from the use of masked projection lithography is combined with high-repetition presentation of the substrate for very high-speed, very-high-precision micro-via-pattern drilling at low cost for high production volumes.

Yet another advantage of the invention is that the flow resistance of a micro-nozzle array can be dissociated from the thickness of the substrate by adjusting the relative depths of the cups and of the stems of cup/funnel-configured via holes in the array.

Other objects, features and advantages of the invention will be apparent from the following written description, claims, abstract and the annexed drawings.

BRIEF DESCRIPTION OF THE SEVERAL VIEWS OF THE DRAWING

FIG. 1 is a semi-schematic view of a preferred embodiment, shown as in use to carry out the initial partial drilling of an array of micro-via-holes by dimpling.

FIG. 2 is a semi-schematic view of a simplified version of an individual dimpler of the preferred embodiment shown in FIG. 1.

FIG. 3 is a side elevation view of a two-stage laser system for drilling configured micro-via-holes, shown semi-schematically in use.

FIG. 4 is a side elevation cutaway view of a thin plastic ribbon substrate with three differently configured micro-via-holes.

FIG. 5 is a side elevation cutaway view of a thin plastic ribbon substrate with stem/cup configured micro-via-holes.

FIG. 6 is a side elevation cutaway view of a thin plastic ribbon substrate with micro-via-holes configured as canted cup/funnels.

FIG. 7 is a side elevation cutaway view of a thin plastic ribbon substrate with micro-via-holes configured as cone-stem cups.

DETAILED DESCRIPTION OF THE INVENTION

Pilot System

Figure 8:
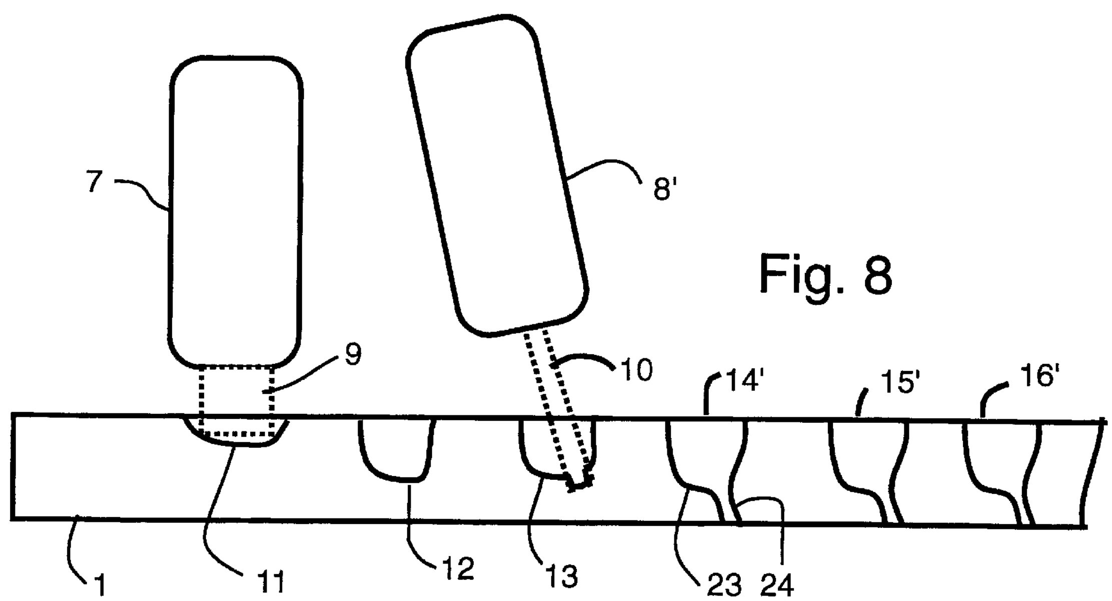
FIG. 8 is a side elevation schematic view of two-stage laser drilling equipment for micro-via-holes configured as canted cup/funnels in a thin plastic ribbon substrate.

FIGS. 1 and 2, which should be considered together, function to provide a pattern of dimples to serve as the cups of configured micro-via-holes in ribbon substrate 1. Feed rollers 2 provide ribbon substrate 1 to dimpling roller 3 which presses dimplers 4 into ribbon substrate 1, which is resting on anvil roller 5. The result is that ribbon substrate 1 has a number of dimples 6 pressed into it. Dimplers 4, and dimpling roller 3 as required, are preferably heated to cause plastic flow out of the dimples 6.

FIG. 1 and FIG. 2 are useful in a pilot system to make cup dimples in the surface of the substrate 1. Dimpler wheel 3 has dimplers 4 which press into substrate 1 as it passes over anvil roller 5. The substrate 1 dimples 6 act as cups, preferably at the exit side of each via-hole in the substrate 1 After dimpling, each via-hole is completed by a mating laser-drilled hole through from the cup dimple 6 to the opposite surface.

Production System

FIGS. 3–12 illustrate a preferred production system.

Single-Surface Production Illumination

FIG. 3 shows, greatly simplified, a system using two lasers 7 and 8 to drill the cups and the stems, respectively, of cup/funnel via holes, in a single pass of the substrate 1 past the drilling station. Laser 7 produces wide beam 9; laser 8 produces narrow beam 10. Wide beam 9 drills cups 11–16 halfway through the substrate 1. Narrow beam 10 drills stem holes 17–20 respectively from cups 13–16 to the opposite surface of substrate 1, connecting via holes 17–20 respectively with cups 13–16.

Note that FIG. 3 is shown simplified. In production, it is advisable to use the overlapping complementary polygonal scanning technique, with mask and substrate mounted on a common stage, described in the Jain et al. U.S. patent applications listed in the Prior Art section. Note that, depending upon the power of the laser, the configuration of the via-holes and the characteristics of the substrate, it is possible for one laser to drill an entire array pattern of via holes without changing the substrate position on the stage. Beam 9, for example, if properly masked, may be drilling a pattern of a thousand cup-holes in the position shown as cup 11, with beam 9 actually being a single beam scanning a thousand holes in a mask. Each micro-via-hole pattern thus may include a multiplicity of via-holes. Similarly, laser 8 provides drilling beam 10, which is narrower than drilling beam 9, or which has more narrowly constricted sub-beams, to perform the drilling of the narrow stems. Cup 11 is in the process of being drilled; completed cup portions 12–16 are shown. Stem portion 17 is in the process of being drilled; completed stem portions 18–20 are shown. Care must be taken in aligning the stem portions with the cup portions for each array. Much of the alignment, once achieved, is retained so long as the substrate is not moved. Alignment techniques used in semiconductor patterning are effective here.

FIGS. 4–7 illustrate three differing micro-via-hole configurations, with three differing cup/funnels 14, 23 and 25 in one substrate strip in FIG. 4; straight-stem cup/funnels 21–22 in FIG. 5; canted-stem cup/funnels 23–24 in FIG. 6; and cone-base cup/funnel 25–26 in FIG. 7.

Note that while it is preferred to use two different lasers for cup and stem, respectively, it is also possible to use a single laser, but to alter the focus and the effective drilling time to drill different sizes of cup/funnel and cone/stem-base. Focus alterations can be done by various means, such as by a vertical shift of the substrate with respect to the mask.

Configurations of Via Holes

FIG. 8 shows a two-stage laser drilling apparatus for configuring canted cup/funnel via holes. The ribbon substrate is fed right-to-left. Laser 7 provides a wide beam 9 which drills a standard cup 11 into the surface of substrate 1. Laser 7 has already drilled the cup portions of cup/funnels 12–13 and 14'–16'. Cup funnel 14', for example, already has been completed with cup portion 23 and stem portion 24. The stem portion of cup/funnel 13 is being drilled by laser beam 10 of laser 8', which is arranged non-perpendicularly, at an angle to provide a narrow laser beam 10, with the desired cant, to the canted-stem cup/funnel configurations being drilled.

Figure 9:
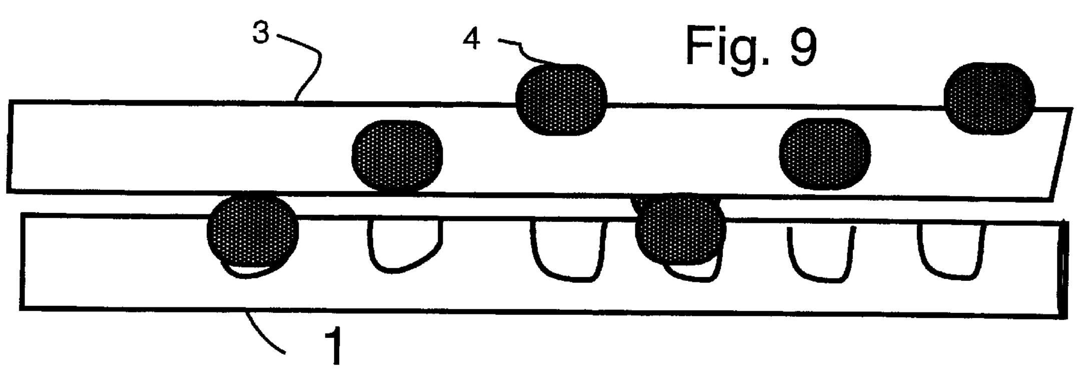
FIG. 9 is a side elevation schematic view of a dimpler for first-stage forming of cups for micro-via-holes configured as canted cup/funnels in a thin plastic ribbon substrate.

FIG. 9 shows a cylindrical dimpler roller 4 in greater detail than in FIG. 1. The cup dimpler 4 provides configured pressure to cause flow in the substrate material; heat may be applied as required.

Figure 10:
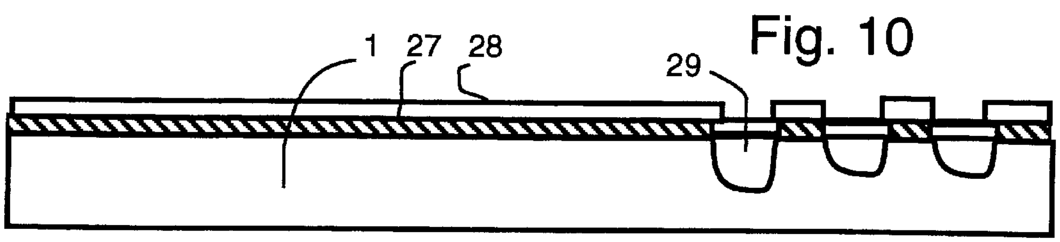
FIG. 10 is a side elevation schematic view of first-stage drilling technique in which a photoresist is patterned for etching or ablation of first-stage cups for micro-via-holes.

FIG. 10 shows a photoresist technique for providing an intermediate substrate for self-masked laser ablation of the cup portions of the cup/funnels. Photoresist layer 27 is exposed and developed to provide a pathway through its protective layer in which etching or other ablation may take place. The cups are then prepared and further configurations are made as before. It is possible to use the laser as the ablating mechanism, by overplating photoresist layer 27 with a mirror layer 28 which reflects the laser beam away. The laser beam then can serve in two phases to ablate first the cup and then, after refocusing or remasking, to ablate the stem. The substrate intermediate, for use in making micro-via arrays of configured via-holes, is made by the following process, comprising:

step a) coating the substrate with a and protective metallic layer 27 for passivation against subsequent laser drilling:

step b) coating the metallic-layer-coated substrate with a protective photoresist layer 28 for passivation against subsequent chemical etching:

step c) exposing the twice-coated substrate with an array pattern for defining cup portions of the array to be made;

step d) removing photoresist from the exposed pattern;

step e) chemically etching away the metallic layer in the exposed pattern;

step f) removing the remnants of the photoresist layer.

The intermediate is thus patterned for self-masked laser ablation of the cup portions of the micro-via hole array.

Figure 11:
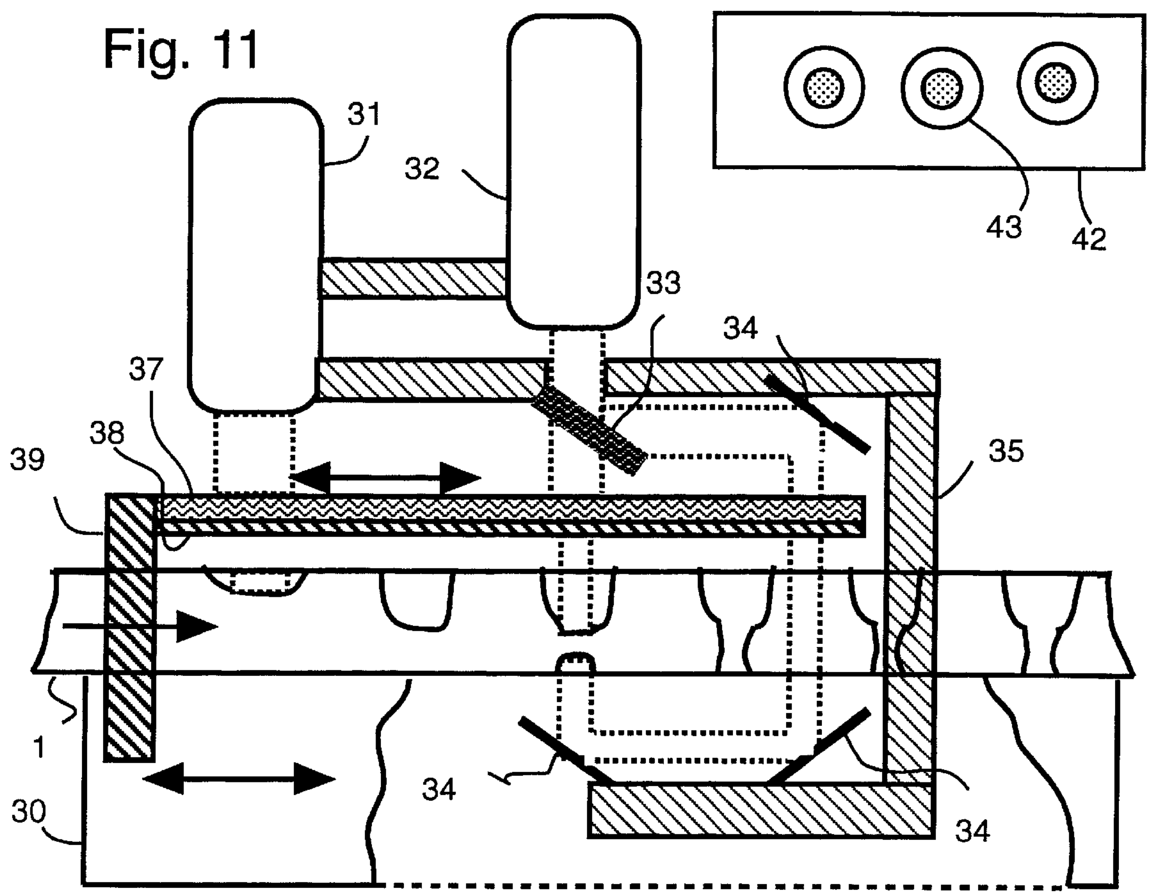
FIG. 11 is a side elevation schematic view of equipment for first-stage and coordinated top and bottom registered drilling, in which each micro-via-hole is configured with a cup and a pinch-waist stem.
Figure 12:
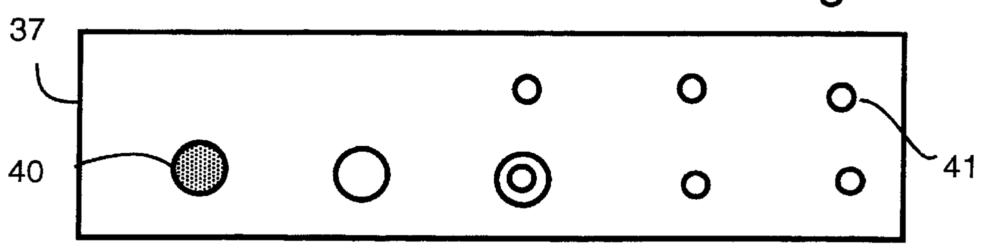
FIG. 12 is a simplified plan view of a mask for laser drilling of configured holes in two stages.

FIG. 11 shows how a complex configuration may be provided to the configured micro-via-holes in the array. A first laser 31 drills the cups. A second laser 32 drills the top portions of the stems. Note that, while individual micro-via-holes are shown, in practice the laser beam is patterned to ablate an entire array of holes simultaneously. The beam from the second laser 32 passes partially through a beam splitter 33, and is partially reflected along a path of beam-directing mirrors 34 so as to drill the bottom portions of the stems directly in line with the top portions. As shown, this results in an array of configured micro-via-holes, each in the configuration of a cup/funnel with a pinch-waist stem. The configuration can be adjusted by adjusting the sub-beam diameters, sub-beam configurations, beam strength or beam duration of the various laser beams. FIG. 12, greatly simplified, shows a representative array mask 37, with cup stencils 40 and stem stencils 41 set up for use in the coordinated top/bottom laser drilling equipment of FIG. 11.

High-Throughput Via-Drilling Production System

The production embodiment of the invention for a high-throughput via-drilling production system is similar to the design of the pilot system except that it utilizes an industrialized, high-powered excimer laser such as the LP 3308 from Lambda Physik. This excimer laser is a 3000 series industrialized system with output wavelength at 308 nm. It can produce 150 W of output power at 300 Hz repetition rate. The laser system is controlled via a LAN fiber optic data ring and PC controller which maintains a history and logbook file. The system also has control capability using RS-232 interfacing and modem support.

The laser pulse energy is 500 mJ during stabilized operation at 300 Hz. This makes it possible to simultaneously feed up to 15 beamlines and generate up to 20 nozzle array patterns simultaneously in an exposure time as short as 2 seconds. This translates to a throughput of approximately 10 multi-via strips per second, depending primarily upon substrate delivery time.

Two-Surface Illumination

FIG. 11 shows an illumination system comprising a stage 30, two lasers 31 and 32, and a semi-reflective mirror beam divider 33 feeding the beam from laser 32 to both sides of the substrate simultaneously as directed by mirrors 34. All lasers and mirrors, as well as substrate 1, are shown schematically as being supported by bridge 35. In practice, it is usually advantageous to mount the lasers and bridge separately to a common structure, to use standardized beam-directing mirrors to direct the beam appropriately, and to mount the stage 30 separately to move the substrate 1 and any required mask 37. The mask 37 is held in mask holder 38 which is mounted to the stage 30 by mask bridge 39. The optics remain fixed; the substrate 1 and mask 37 are moved in exact synchronism by stage 30.

FIG. 12 shows, greatly simplified, detail of mask 37. Cup-stencil holes 40 and stem-stencil holes 41 are arranged to operate with the coordinated to-bottom scanning equipment shown in FIG. 11. This accounts for the double set of stem-stencil holes 41, positioned so that the stem is drilled from two sides to meet within the bulk of the substrate 1.

Figure 13:
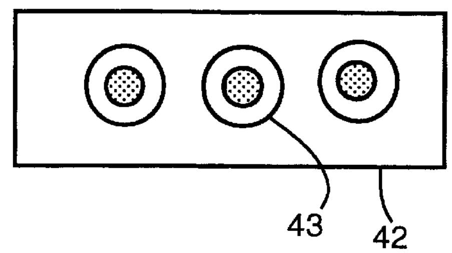
FIG. 13 is a simplified plan view of an aerosol nozzle with cup/funnel via holes configured by the coordinated top/bottom equipment of FIG. 11 according to the mask of FIG. 12.

FIG. 13 shows, also greatly simplified, the completed array 42, which is a section cut from a substrate 1, having three holes shown as straight cup/funnels 43.

Process and Product-By-Process

FIGS. 4–7 show representative multi-hole via-patterns in a nozzle structure for aerosols, as produced by the process. The process results in an economical, high-quality via-patterned nozzle blank, having a via-pattern as required, cut from the substrate 1. Note the representative via-holes 21–26 are shown enlarged, but not exactly to scale. Each entry hole and the related exit hole, of the individual via-holes produced by the process, conforms to its own assigned configuration criterion. The nozzle structure, produced by the process of drilling micro-vias in a substrate according to a set of related masks, is characterized by the following steps:

(Step 1) Providing laser means to provide a beam having sufficient power to perform simultaneous via-hole-drilling of a large number of via-holes;

(Step 2) Arranging beam processing to accept the beam output of said laser means and forward a shaped beam with a selected numerical aperture;

(Step 3) Arranging homogenizer recollimator means to accept the beam Output of said beam processing means and forward a shaped, nearly collimated beam; and (Step 4) Arranging masking means to reconfigure the beam output into a set of sub-beams in an operational pattern, individual sub-beams differing in at least one parameter so as to configure a via hole differently at differing depths.

Summary

Laser drilling of micro-via-holes not only "drills" an array of a great number of very tiny via-holes through a ribbon substrate, but can also configure the individual micro-via-holes for optimums of flow with cleanability. Generally, such optimums of flow are found where a reversed wineglass-shaped funnel configuration is used. This permits the ribbon substrate to be reliably strong, with individual via-holes being of small diameter at the entrance to resist clogging by particles, and larger at the exit to permit greater flow. Where clogging is not a major consideration, however, it may be advisable to have conical or cylindrical hole configurations, hourglass configurations, upright wineglass configurations, or canted configurations.

While the invention has been shown and described in terms of a number of embodiments, with a number of suggested modifications for special needs, for a number of uses, it will be clear that further modifications and additional uses are possible.

What is claimed is:

1. A micro-via patterned substrate made by the following process:

Step a) laser pre-drilling into a first surface of said substrate an enlarged cup portion of each of a number of micro-via holes to be configured;

Step b) laser drilling into the bottom of each of said enlarged cup portions a partial stem portion; and Step c) laser drilling a stem portion toward the bottom of each of said cups from the opposite surface of said substrate, to meet said partial stem portion;

whereby each of the micro-vias has a configuration including a cup portion and a stem portion and said stem portion has two portions differing in diameter.

2. Apparatus for ablating a selected array pattern of micro-via holes with selected configuration, characterized by:

a) stage means (30) for carrying a substrate (1) for scanning, and also for carrying a mask (37) with the selected array pattern;

b) laser means for ablating a pattern of cup portions, according to a cup (stencil pattern on said mask (37), during a scan operation using complementary overlapping polygonal scans; and c) laser means for ablating a pattern of stem portions, according to a stem stencil pattern on said mask (37), during said scan operation using complementary overlapping polygonal scans;

whereby each of the micro-vias has a configuration including a cup portion and a stem portion which is smaller in area than said cup portion.

3. Apparatus for drilling a selected array pattern of micro-via holes with selected configuration, according to claim 2, further characterized in that:

d) said laser means for ablating a pattern of stem portions is positioned away from perpendicular to the surface of said substrate, to form canted-stem cup/funnels.

4. Apparatus for drilling a selected array pattern of micro-via holes with selected configuration, according to claim 2, further characterized in that:

d) said laser means for ablating a pattern of stem portions is adjusted to provide a conical connection from the surface of said substrate opposite to said cup portions, to form cone/stem-base cup/funnels.

5. Apparatus for drilling a selected array pattern of micro-via holes with selected configuration, according to claim 2, further characterized in that:

d) said laser means for ablating a pattern of stem portions is a single laser whose output beam is divided so as to provide a first sub-beam for the cup portions of the micro-via hole array and to provide a second sub-beam for the stem portions of the micro-via hole array, so as to ablate the cup portion and the stem portion of each of the array cup/funnels separately.

6. Apparatus for drilling a selected array pattern of micro-via holes with selected configuration, according to claim 2, further characterized in that:

d) said laser means for ablating a pattern of stem portions is a plurality of lasers whose output beams provide a first beam for the cup portions of the micro-via hole array and a second beam for the stem portions of the micro-via hole array, so as to ablate the cup portion and the stem portion of each of the array cup/funnels separately.

7. Apparatus for drilling a selected array pattern of micro-via holes with selected configuration, according to claim 2, further characterized in that:

d) said laser means for ablating a pattern of stem portions is a plurality of lasers whose output beams provide a first beam for the cup portions of the micro-via hole array and a second beam for the stem portions of the micro-via hole array, so as to ablate the cup portion and the stem portion of each of the array cup/funnels separately; and e) said laser means includes bridge means and beam directing mirror means which provide for drilling simultaneously from within each cup portion and from the substrate (1) surface opposite said cup portions;

whereby the stem portions of each cup are drilled to meet within the bulk of said substrate (1) below the surfaces.

8. A nozzle structure, produced by the process of ablating individual cup portion/first stem portion/second stem portion micro-vias in a substrate according to a set of related masks, characterized by the following steps:

step a) Providing laser means to provide a beam having sufficient power to perform simultaneous via-hole-drilling of a large number of via-holes;

step b) Arranging beam processing to accept the beam output of said laser means and forward a shaped, nearly collimated beam with a selected numerical aperture;

step c) Arranging masking means to reconfigure the beam output into a set of sub-beams in an operational pattern, individual sub-beams differing in at least one of the parameters of direction, focus and duration so as to configure individual via-holes differently at differing depths with abrupt changes between portions.

* * * * *